(12) United States Patent
Collette et al.

(10) Patent No.: US 10,381,944 B2
(45) Date of Patent: Aug. 13, 2019

(54) MODULAR CONFIGURABLE ADJUSTABLE-SPEED DRIVE

(71) Applicant: Toshiba International Corporation, Houston, TX (US)

(72) Inventors: Michael Collette, Houston, TX (US); John T. Kelley, Houston, TX (US); Enrique Martinez, Cypress, TX (US)

(73) Assignee: Toshiba International Corporation, Houston, TX (US)

( * ) Notice: Subject to any disclaimer, the term of this patent is extended or adjusted under 35 U.S.C. 154(b) by 310 days.

(21) Appl. No.: 15/467,693

(22) Filed: Mar. 23, 2017

(65) Prior Publication Data

US 2018/0278171 A1 Sep. 27, 2018

(51) Int. Cl.
*H02M 7/00* (2006.01)
*H05K 7/14* (2006.01)

(52) U.S. Cl.
CPC .......... *H02M 7/003* (2013.01); *H05K 7/1432* (2013.01)

(58) Field of Classification Search
CPC ............................ H05K 7/1432; H02M 7/003

USPC .......................................................... 174/50
See application file for complete search history.

(56) References Cited

U.S. PATENT DOCUMENTS

| 6,448,498 | B1 * | 9/2002 | King | A47B 21/06 108/50.02 |
| 7,075,004 | B1 * | 7/2006 | Gretz | H02G 3/085 174/50 |
| 8,193,444 | B2 * | 6/2012 | Rodenberg | H02G 3/126 174/50 |
| 9,035,175 | B2 * | 5/2015 | Korcz | H02G 3/086 174/50 |

* cited by examiner

*Primary Examiner* — Dhiru R Patel
(74) *Attorney, Agent, or Firm* — Baker Botts L.L.P.

(57) ABSTRACT

Presently disclosed embodiments are directed to an adjustable-speed drive comprising a transformer module and an inverter module configured for installation in either of a side-by-side or stacked configurations. The disclosed embodiments utilize a modular design for the transformer and inverter modules. Thus, the adjustable-speed drive is capable of being installed in either of a side-by-side configuration or a stacked configuration. This modular design allows for installation at a site in accordance with the space limitations of any given location.

13 Claims, 10 Drawing Sheets

MODULAR CONFIGURABLE ADJUSTABLE-SPEED DRIVE

TECHNICAL FIELD

Embodiments of the present disclosure relate to adjustable-speed drive systems and, more particularly, to a stacked medium voltage adjustable-speed drive that can be installed in both side-by-side and vertically stacked configurations.

BACKGROUND

Adjustable-speed drives are devices commonly used to provide speed control to a motor across a continuous range of possible speeds. This provides much greater equipment flexibility as compared to traditional single speed gearboxes or discrete multi-speed motors. Because of their versatile nature, adjustable-speed drives are increasingly popular for use in a variety of mechanical applications.

A type of adjustable-speed drive relies in part on a combination of a transformer module and a power inverter module. The transformer-module receives a high voltage alternating current ("AC") stream and lowers the voltage to a usable level. The power inverter module takes the AC stream and converts it to a direct current ("DC") stream. The adjustable-speed drive may then control the output of the DC stream so as to simulate a wide range of AC output streams. A user may set the desired speed controls and the adjustable-speed drive will adjust the simulated AC output to match the desired speeds.

Transformer modules and power inverter modules are large, heavy pieces of equipment. Accordingly, traditional adjustable-speed drive design only allows for installation of the transformer module and the power inverter module in a side-by-side configuration. In particular, medium voltage adjustable-speed drives are only available for installation as one or more side-by-side modules, having a relatively large footprint. Many plants and operating facilities face significant space constraints. Depending on the location, space may be more limited in either the horizontal or vertical directions. Therefore, a need exists for a medium-voltage, adjustable-speed drive that is capable of meeting the size restrictions of a given location.

SUMMARY

In accordance with the above, presently disclosed embodiments are directed to an adjustable-speed drive comprising a transformer module and an inverter module configured for installation in either of a side-by-side or stacked configurations. The presently disclosed adjustable-speed drive systems utilize improved housing configurations and overall equipment design. In the first position, referred to herein as the side-by-side position, the power inverter module is positioned proximate to and alongside the transformer module. In the second position, referred to herein as the stacked position, the power inverter module is positioned proximate to and elevated above the transformer module.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Illustrative embodiments of the present disclosure are described in detail herein. In the interest of clarity, not all features of an actual implementation are described in this specification. It will of course be appreciated that in the development of any such actual embodiment, numerous implementation specific decisions must be made to achieve developers' specific goals, such as compliance with system related and business related constraints, which will vary from one implementation to another. Moreover, it will be appreciated that such a development effort might be complex and time consuming, but would nevertheless be a routine undertaking for those of ordinary skill in the art having the benefit of the present disclosure. Furthermore, in no way should the following examples be read to limit, or define, the scope of the disclosure.

Adjustable-speed drive systems are considered to be versatile, efficient pieces of equipment for use in plant control and design. Said drive systems provide maximum flexibility and equipment control in a single drive unit. In addition, a particular motor may be operated at any speed to achieve maximum efficiency for any given set of conditions, rather than being limited to particular preset speeds. Adjustable-speed drives also provide for real-time adjustment of motor speed in response to dynamically changing process conditions. These drive systems can, however, be quite large and may not be suitable for installation in environments where space is limited.

The drive systems of the present disclosure generally comprise two separate modules: a transformer module and a power inverter module. The presently disclosed adjustable-speed drive systems utilize improved housing configurations and overall equipment design to provide for installation in either of two positions. In the first position, referred to herein as the side-by-side position, the power inverter module is positioned proximate to and alongside the transformer module. In the second position, referred to herein as the stacked position, the power inverter module is positioned proximate to and elevated above the transformer module. As described in detail below, this enables a particular adjustable-speed drive to be installed in a larger variety of locations, including those that may previously have been unsuitable due to space and size restrictions. In particular, at certain locations, space may be height limited or restricted, making installation in the side-by-side configuration desirable. At other locations, overall square footage may be more limited, making installation in the stacked configuration desirable.

Figure 1A:
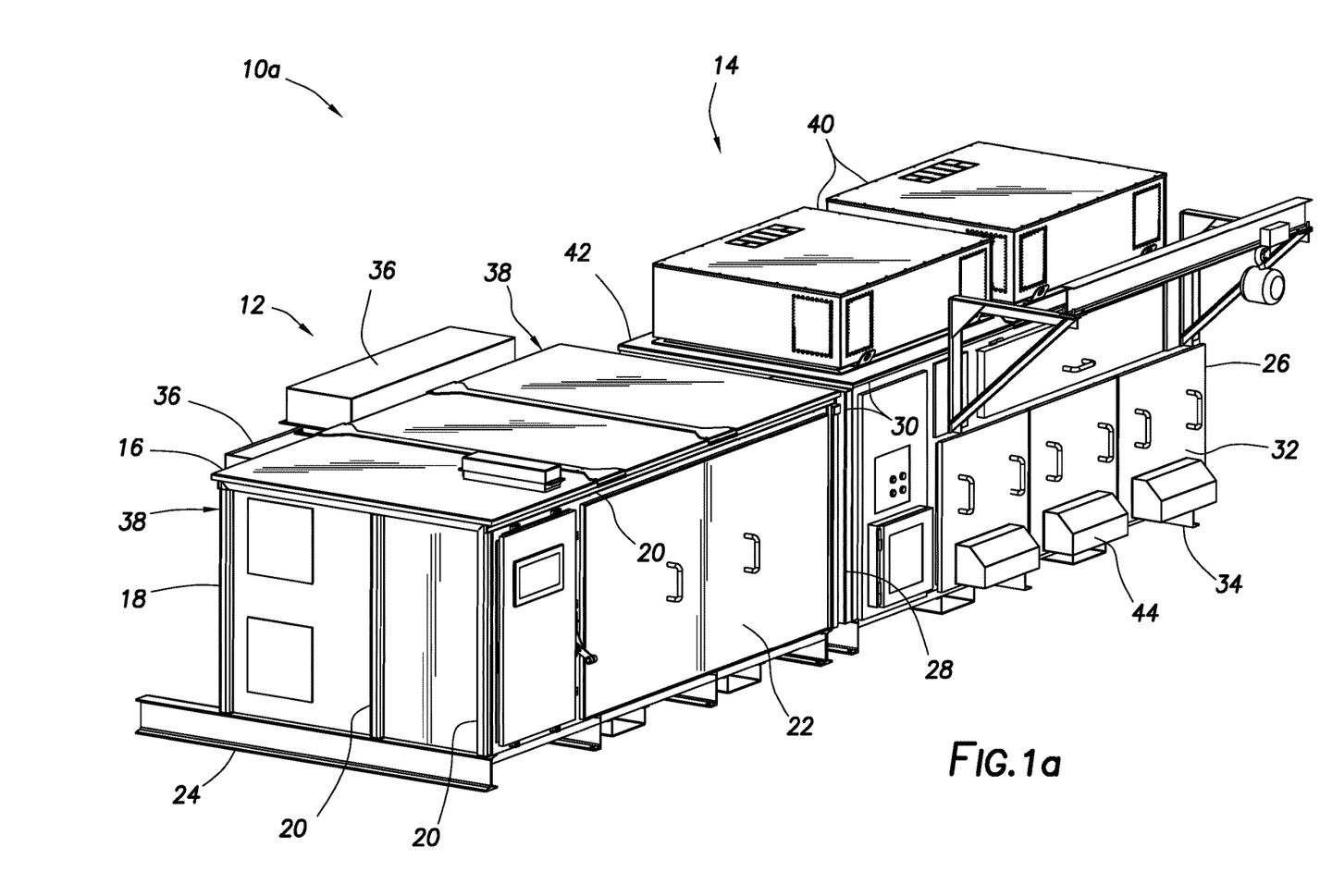
FIG. 1a is a schematic depiction of an adjustable-speed drive system installed in a side-by-side configuration, in accordance with an embodiment of the present disclosure.

Turning now to the drawings, FIG. 1a illustrates an embodiment of an adjustable-speed drive system 10a shown in the side-by-side configuration. Drive system 10a includes transformer module 12 and power inverter module 14. In the side-by-side configuration, power inverter module 14 is positioned proximate to and alongside transformer module 12. As illustrated, transformer module 12 generally comprises a first electrical cabinet 16. In one or more embodiments, the first electrical cabinet 16 may be rated for outdoor installation. The first electrical cabinet 16 may comply with one or more industrial ratings standards, including, but not limited to, ratings standards issued by the National Electrical Manufacturers Association ("NEMA") and Ingress Protection ("IP") ratings standards issued by the International Electrotechnical Commission ("IEC"). The first electrical cabinet 16 may meet or exceed NEMA 3R and IP45 requirements. First electrical cabinet 16 may further comprise a first frame 18 configured to provide structural support for transformer module 12. The first frame 18 may comprise a plurality of metal rails 20 positioned along the edge of so as to define the first electrical cabinet 16. Metal rails 20 may generally be positioned along the edges and corners of first electrical cabinet 16. As would be understood by one of ordinary skill in the art having the benefit of the present disclosure, additional metal rails 20 may be positioned as needed to provide adequate support.

First electrical cabinet 16 may further comprise a plurality of first electrical cabinet covers 22 coupled to the first frame 18 to define a generally rectangular box having a hollow interior. First electrical cabinet covers 22 may comprise any material suitable for electrical equipment storage, including, but not limited to aluminum, steel, and stainless steel. In embodiments where drive system 10a is to be installed outdoors, first electrical cabinet covers 22 may be constructed from a material suitable for installation in an outdoor environment and capable of withstanding elements such as rain, sun, and extreme temperatures. In one or more embodiments, the transformer module 12 may further comprise a heavy duty base 24 mounted to the bottom of the first electrical cabinet 16. Heavy duty base 24 may be configured to provide support for transformer module 12 as installed at a location. Heavy duty base 24 may further be configured to provide access to transformer module 12 for transportation purposes, such as through the use of a forklift.

As illustrated, power inverter module 14 generally comprises a second electrical cabinet 26. In one or more embodiments, the second electrical cabinet 26 may be rated for outdoor installation. The second electrical cabinet 26 may comply with one or more industrial ratings standards, including, but not limited to, NEMA 3R and IP45 requirements. Second electrical cabinet 26 may further comprise a second frame 28 configured to provide a jointing frame for power inverter module 14. The second frame 28 may comprise a plurality of metal caps 30 positioned along the edge of so as to define the second frame 28.

Second electrical cabinet 26 may further comprise a plurality of second electrical cabinet covers 32 coupled to the second frame 28 to define a generally rectangular box having a hollow interior. Second electrical cabinet covers 32 may comprise any material suitable for electrical equipment storage, including, but not limited to aluminum, steel, and stainless steel. In embodiments where drive system 10a is to be installed outdoors, second electrical cabinet covers 32 may be constructed from a material suitable for installation in an outdoor environment and capable of withstanding elements such as rain, sun, and extreme temperatures. In one or more embodiments, the power inverter module 14 may further comprise a heavy duty base 34 mounted to the bottom of the second electrical cabinet 26. Heavy duty base 34 may be configured to provide support for power inverter module 14 as installed at a location. Heavy duty base 34 may further be configured to provide access to power inverter module 14 for transportation purposes, such as through the use of a forklift.

During operation, the internal temperatures of transformer module 12 and power inverter module 14 may reach high levels that could damage the equipment contained therein. Accordingly, it is necessary to provide cooling to the modules to keep the temperature at safe operating levels. Therefore, transformer module 12 may further comprise a heat exchanger 36 coupled to the first electrical cabinet 16. As illustrated, heat exchanger 36 is coupled to the back wall 38 of the first electrical cabinet 16. As would be understood by one of ordinary skill in the art, this keeps the top of first electrical cabinet 16 clear to allow for installation of the second electrical cabinet 26 above first electrical cabinet 16 in the stacked configuration. Heat exchanger 36 may be any suitable heat exchanger known in the art, including, but not limited to aluminum, steel, and stainless steel. Similarly, power inverter module 14 may further comprise one or more heat exchangers 40 and one or more cooling assemblies (not shown in FIG. 1a) coupled to the second electrical cabinet 26. As illustrated, heat exchanger 40 is coupled on top of the second electrical cabinet 26.

Figure 1B:
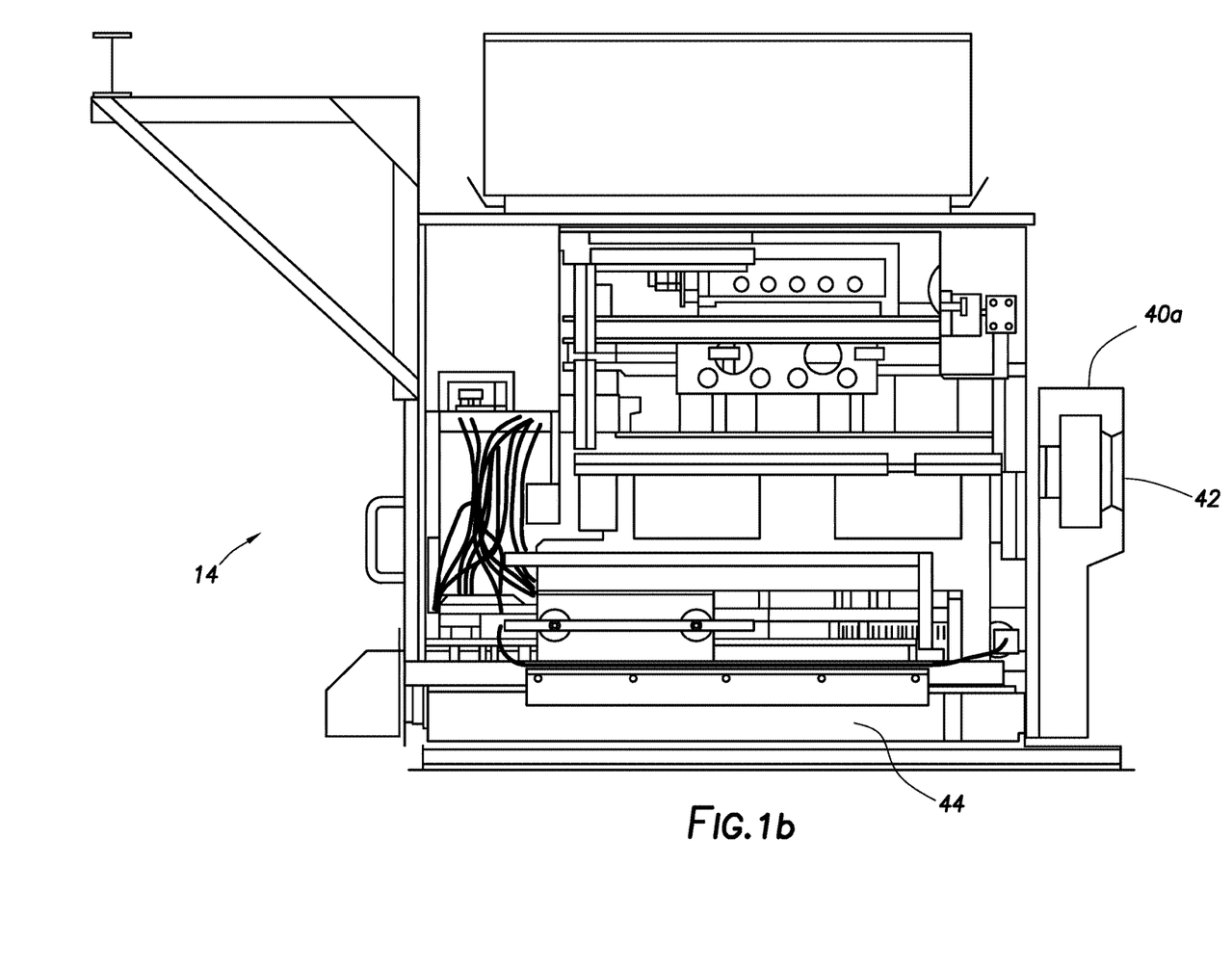
FIG. 1b is a side view of a power inverter module, in accordance with an embodiment of the present disclosure.

Referring now to FIG. 1b, a side perspective view of inverter module 14 is shown. Each cooling assembly 40a may further comprise a fan 42 mounted on the rear of the second electrical cabinet 26 and one air channel 44 passing through the second electrical cabinet 26 per cooling assembly 40a. As would be appreciated by one of ordinary skill in the art, it is undesirable for the electrical components contained in transformer module 12 and power inverter module 14 to be exposed to contaminants such as dust, dirt, and other particulate. In one or more embodiments, heat exchanger 36 and cooling assembly 40 may be configured to cool transformer module 12 and power inverter module 14, respectively, without exposing the internals of either module to outside air and potential contaminants. Air channels 44 may be configured to transfer heat without exposing the interior of the power inverter module 14 to outside air.

Figure 1C:
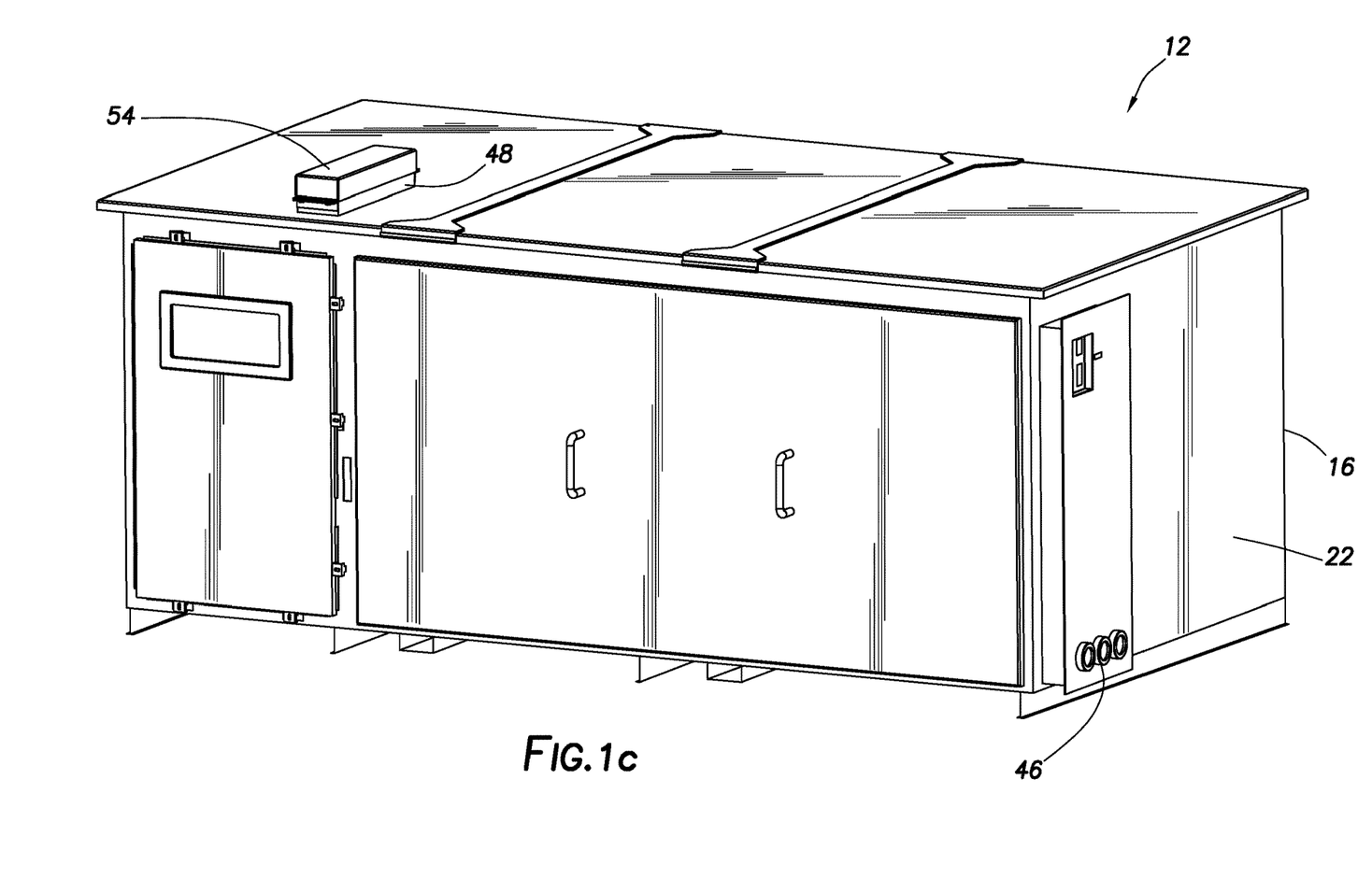
FIG. 1c is a perspective view of a transformer module in a side-by-side configuration, in accordance with an embodiment of the present disclosure.

Referring now to FIG. 1c, a perspective view of transformer module 12 is shown in the side-by-side configuration. First electrical cabinet 16 may comprise a first electrical cabinet side opening 46 and a first electrical cabinet top opening 48. First electrical cabinet side opening 46 may comprise a hole passing through at least one first electrical cabinet wall 22 along an exterior side portion of the first electrical cabinet 16. First electrical cabinet top opening 48 may comprise a hole passing through at least one first electrical cabinet wall 22 along an exterior top portion of the first electrical cabinet 16.

Figure 1D:
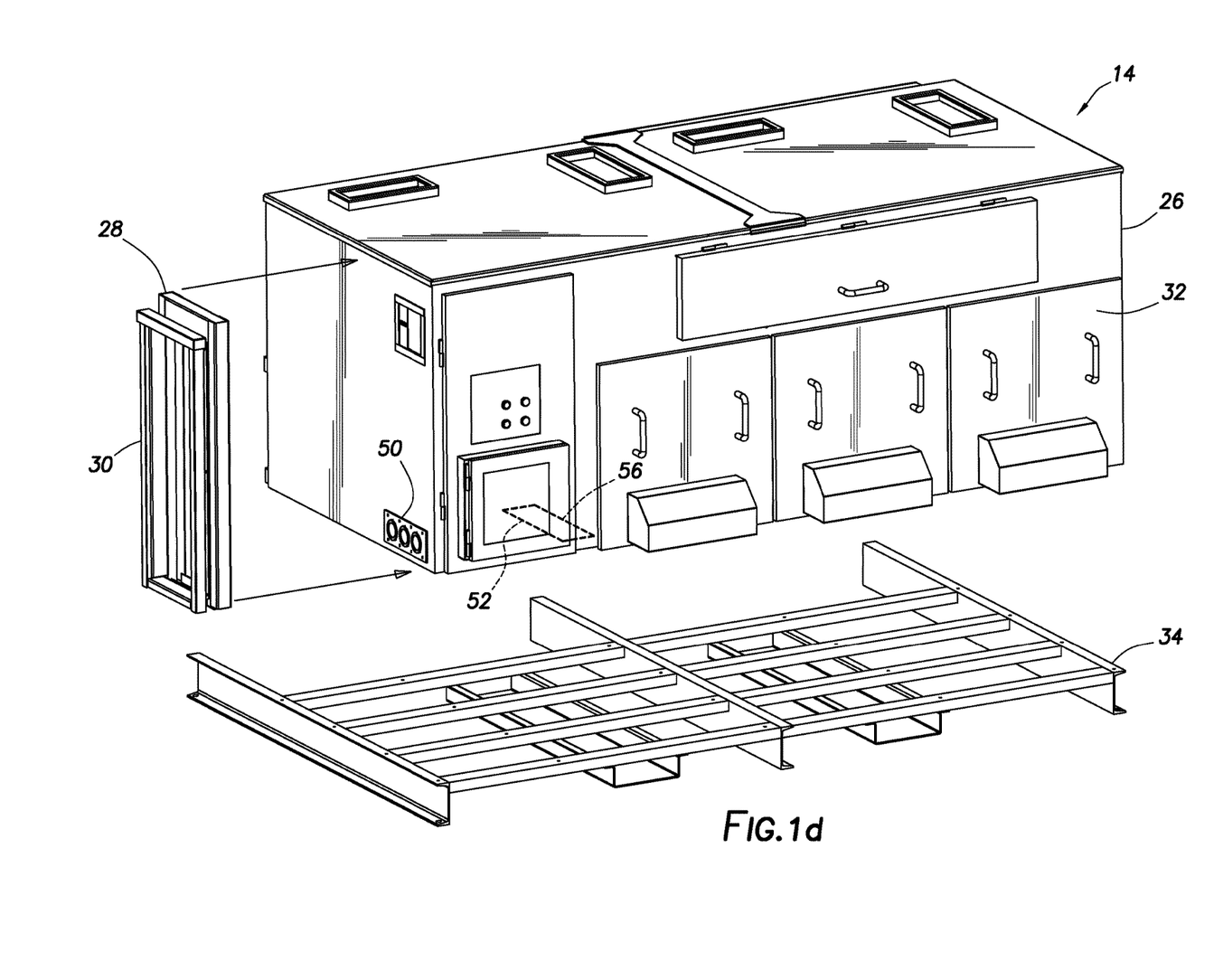
FIG. 1d is a perspective view of a power inverter module in a side-by-side configuration, in accordance with an embodiment of the present disclosure.

Referring now to FIG. 1d, a perspective view of power inverter module 14 is shown in the side-by-side configuration. Second electrical cabinet 26 may comprise a second electrical cabinet side opening 50 and a second electrical cabinet bottom opening 52. Second electrical cabinet side opening 50 may comprise a hole passing through at least one second electrical cabinet wall 32 along an exterior side portion of the second electrical cabinet 26. Second electrical cabinet bottom opening 52 may comprise a hole passing through at least one second electrical cabinet wall 32 along an exterior bottom portion of the second electrical cabinet 26.

As illustrated in the side-by-side configuration, transformer module 12 and power inverter module 14 are coupled at first electrical cabinet side opening 46 and second electrical cabinet side opening 50. These openings create a hole through which wires (not shown) may pass from the transformer module 12 to the power inverter module 14. In order to prevent outside air from entering the first electrical cabinet 16, first electrical cabinet top cover 54 may be coupled to the first electrical cabinet top opening 48. In order to prevent outside air from entering the second electrical cabinet 26, second electrical cabinet bottom cover 56 may be coupled to the second electrical cabinet bottom opening 52. First electrical cabinet top cover 54 and second electrical cabinet bottom cover 56 may create at least a partial seal with first electrical cabinet 16 and second electrical cabinet 26, respectively. This seal prevents exposure of the internals of the cabinets to outside elements.

Figure 2A:
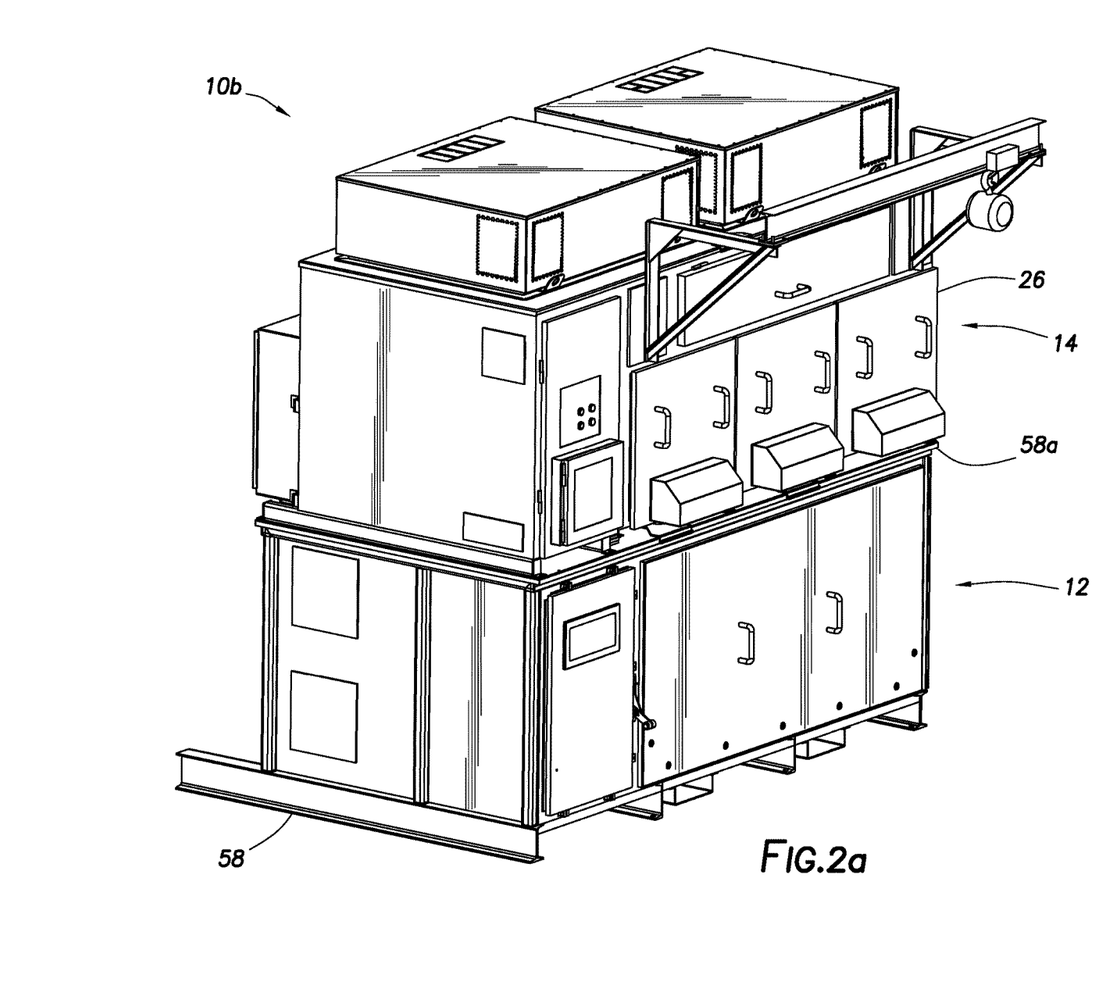
FIG. 2a is a schematic depiction of an adjustable-speed drive system installed in a stacked configuration, in accordance with an embodiment of the present disclosure.

FIG. 2a illustrates an embodiment of an adjustable-speed drive system 10b shown in the stacked configuration. Drive system 10b includes a transformer module 12 and a power inverter module 14. In the stacked configuration, power inverter module 14 is positioned proximate to and elevated above transformer module 12. As would be understood by one of ordinary skill in the art having the benefit of the present disclosure, the primary structural characteristics of the transformer module 12 and the power inverter module 14 remain the same for the stacked configuration as compared to the side-by-side configuration. One difference in the stacked configuration is that the second electrical cabinet 26 does not comprise a heavy duty base. Because power inverter module 14 has a substantial weight, transformer module 12 must be reinforced to support this weight. As illustrated, transformer module 12 further comprises a cage 58. Cage 58 may be disposed along the exterior edges of first electrical cabinet 16. As would be understood by one of skill in the art, cage 58 may comprise any material and configuration necessary to support the weight of power inverter module 14. The inverter module 14 may be attached to a square tube base 58a attached on the top of cage 58

Figure 2B:
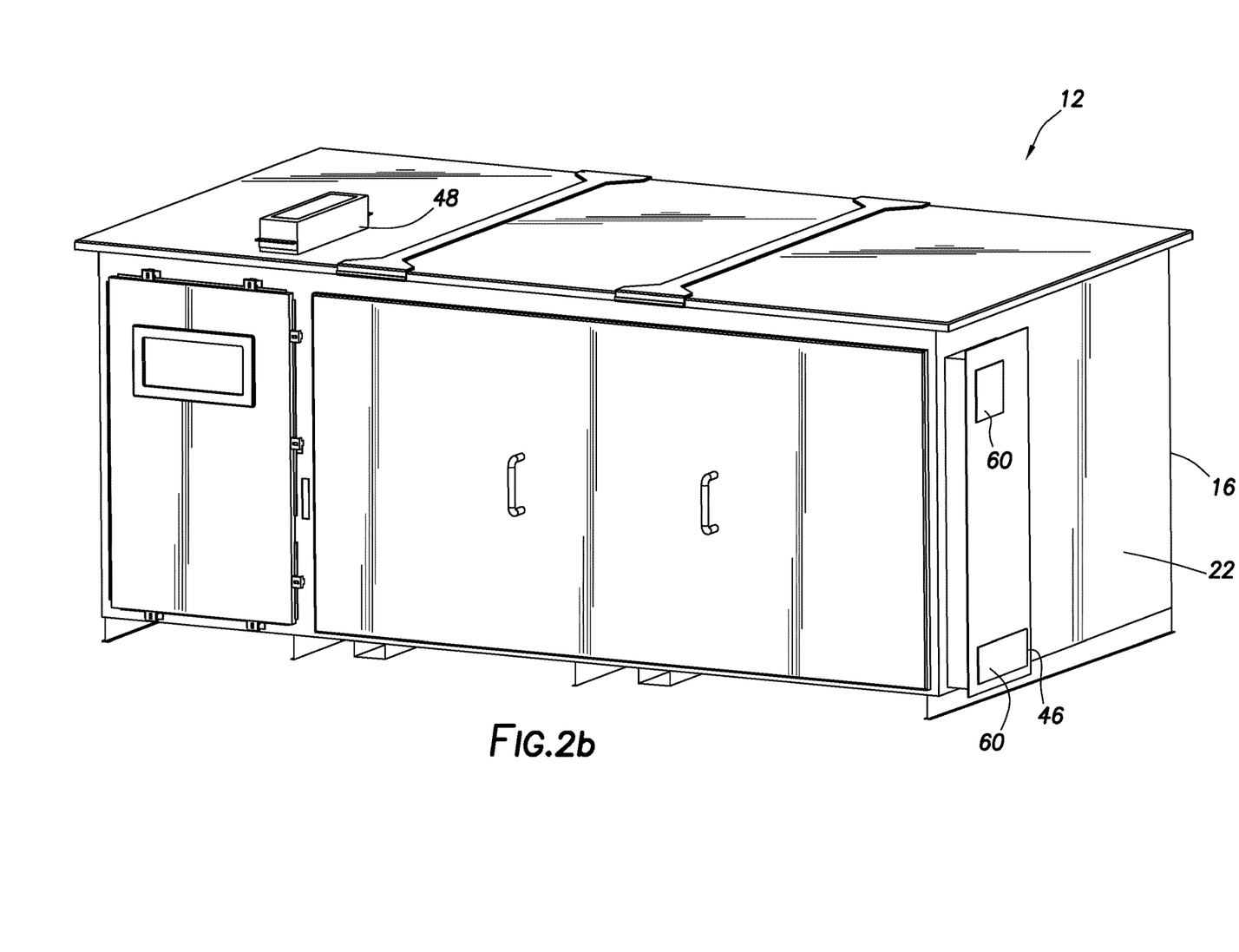
FIG. 2b is a perspective view of a transformer module in a stacked configuration, in accordance with an embodiment of the present disclosure.
Figure 2C:
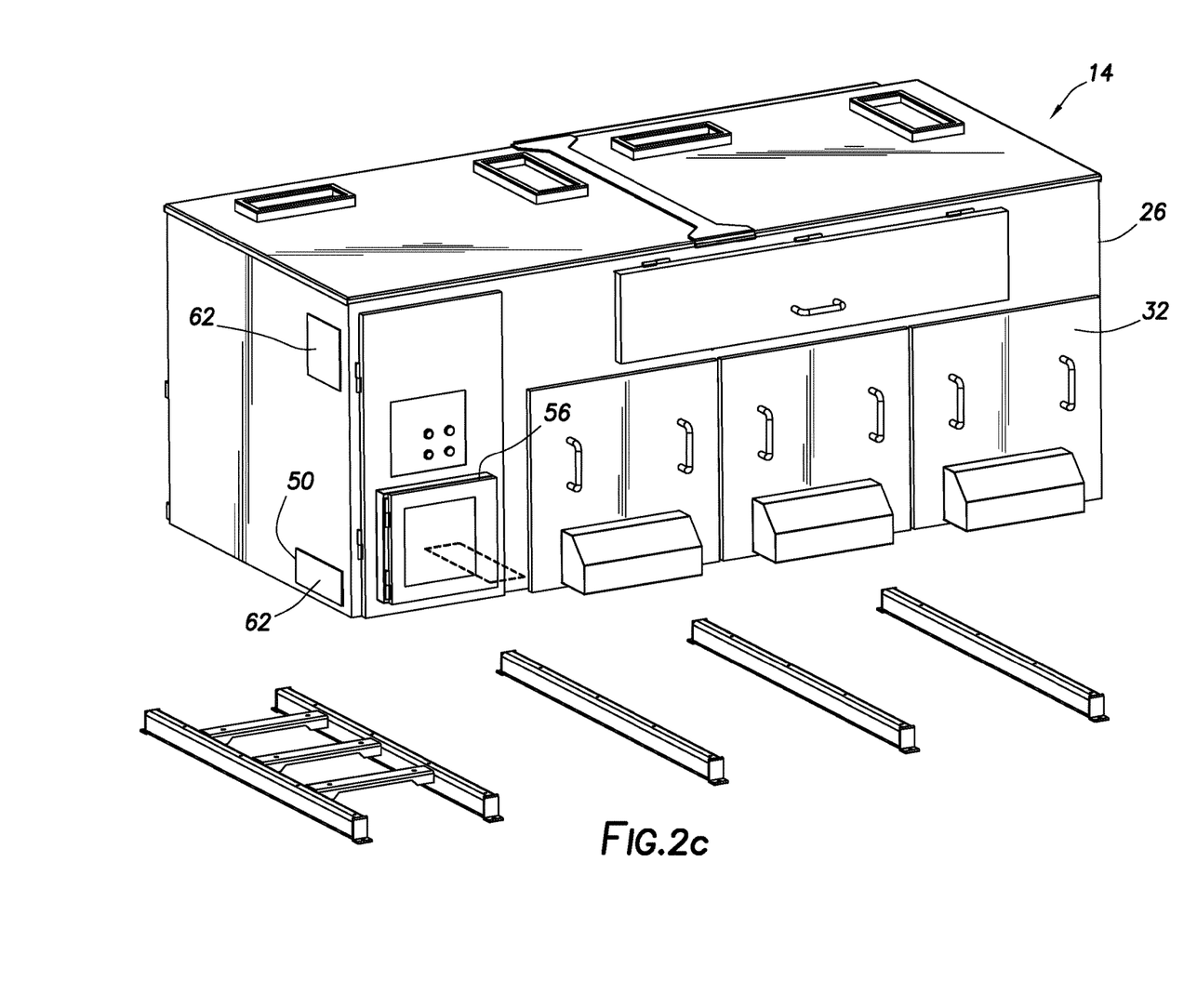
FIG. 2c is a perspective view of a power inverter module in a stacked configuration, in accordance with an embodiment of the present disclosure.

Referring now to FIGS. 2b and 2c, perspective views of transformer module 12 and power inverter module 14 are shown. As illustrated in the stacked configuration, transformer module 12 and power inverter module 14 are coupled at first electrical cabinet top opening 48 and second electrical cabinet bottom opening 52. These openings create a hole through which wires (not shown) may pass from the transformer module 12 to the power inverter module 14. In order to prevent outside air from entering the first electrical cabinet 16, first electrical cabinet side cover 60 may be coupled to the first electrical cabinet side opening 46. In order to prevent outside air from entering the second electrical cabinet 26, second electrical cabinet side cover 62 may be coupled to the second electrical cabinet side opening 50. First electrical cabinet side cover 60 and second electrical cabinet side cover 62 may create at least a partial seal with first electrical cabinet 16 and second electrical cabinet 26, respectively. This seal prevents exposure of the internals of the cabinets to outside elements.

Figure 3:
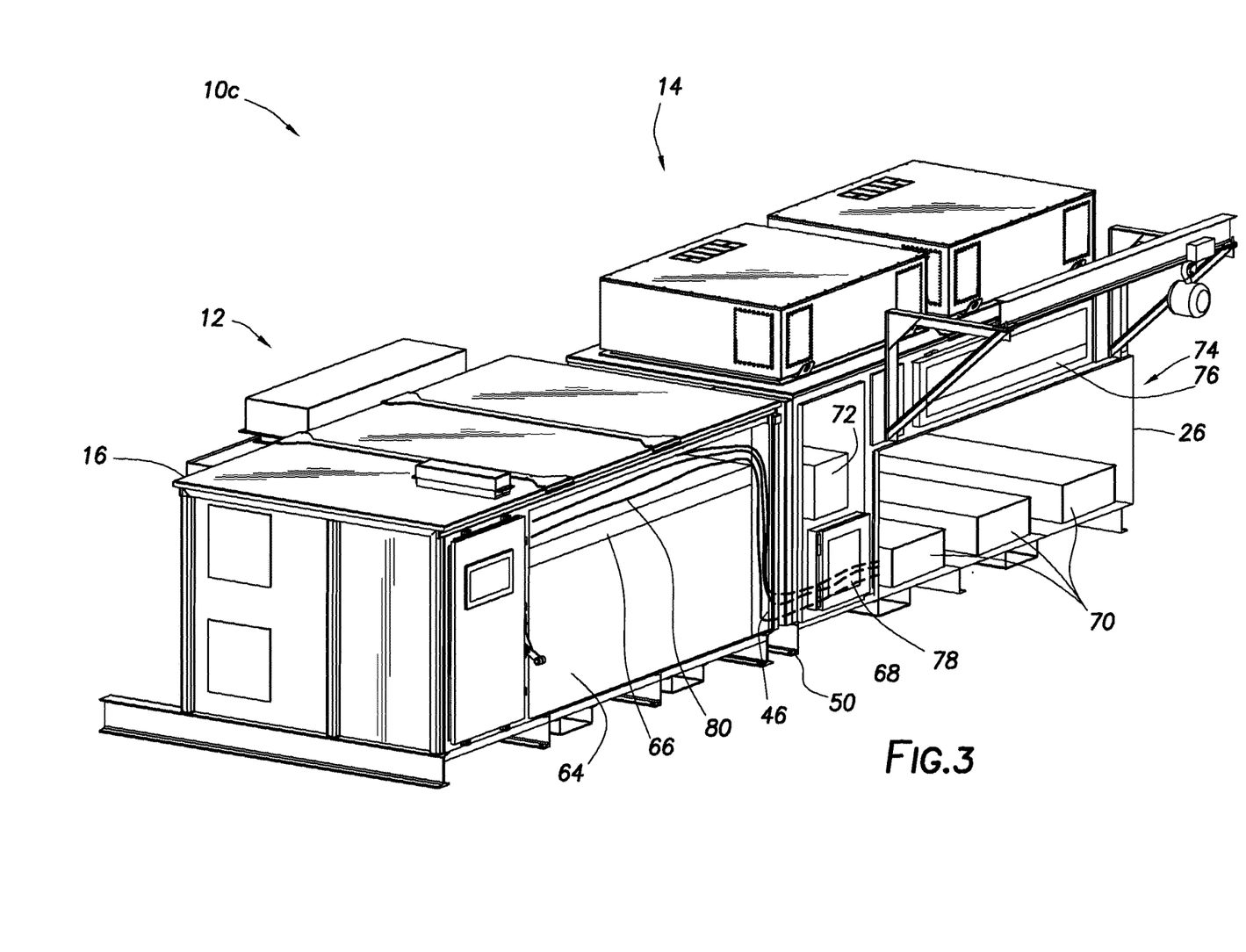
FIG. 3 is a schematic depiction of an adjustable-speed drive system installed in a side-by-side configuration, in accordance with an embodiment of the present disclosure.

FIG. 3 illustrates an embodiment of an adjustable-speed drive system 10c shown in the side-by-side configuration with transparent walls so that the internals of the system may be seen in detail. Transformer module 12 may further comprise a transformer 64 disposed within first electrical cabinet 16. A first wire tray 66 may be disposed within first electrical cabinet 16 and positioned such that wires may be run horizontally through the first electrical cabinet 16. A second wire tray 68 may be disposed within first electrical cabinet 16 and positioned such that wires may be run vertically through the first electrical cabinet 16. Power inverter module 14 may further comprise one or more power inverters 70 disposed within second electrical cabinet 26. As illustrated, a first low voltage control unit 72 may be mounted along a front face 74 of the second electrical cabinet 26. First low voltage control unit 72 may provide electrical and control signals to components of the system that run off of low voltage electricity. For purposes of this disclosure, low voltage generally refers to voltage at or below 600V. First low voltage control unit 72 may be used to provide power to all circuit boards and displays of the adjustable-speed drive system 10c. A second low voltage control unit 76 may be mounted along the front face 74 of the second electrical cabinet 26. Second low voltage control unit 76 may be positioned proximate to and alongside first low voltage control unit 72. Second low voltage control unit 76 may provide electrical and control signals to components of the system that run off of 480V electricity. Second low voltage control unit 76 may be used to provide power and control for all of the fans, heat exchanges, and heaters of the adjustable-speed drive system 10c. Power inverter module 14 may further comprise a user interface device 78 mounted along a top edge of the front face 74 of the second electrical cabinet 26. As would be appreciated by one of ordinary skill in the art, positioning the user interface device 78 at this location in the side-by-side configuration allows for ease of access. User interface device 78 may be any device configured to allow a user to communicate with drive system 10, including but not limited to, a keypad, a touchscreen, a user interface port, or any other suitable device.

Transformer 64 may be coupled to power inverter 70 using one or more wires 80. In the side-by-side configuration, the wires 80 may pass through the first electrical cabinet 16 along first wire tray 66. The wires pass through the first electrical cabinet side opening 46 and the second electrical cabinet side opening 50.

Figure 4:
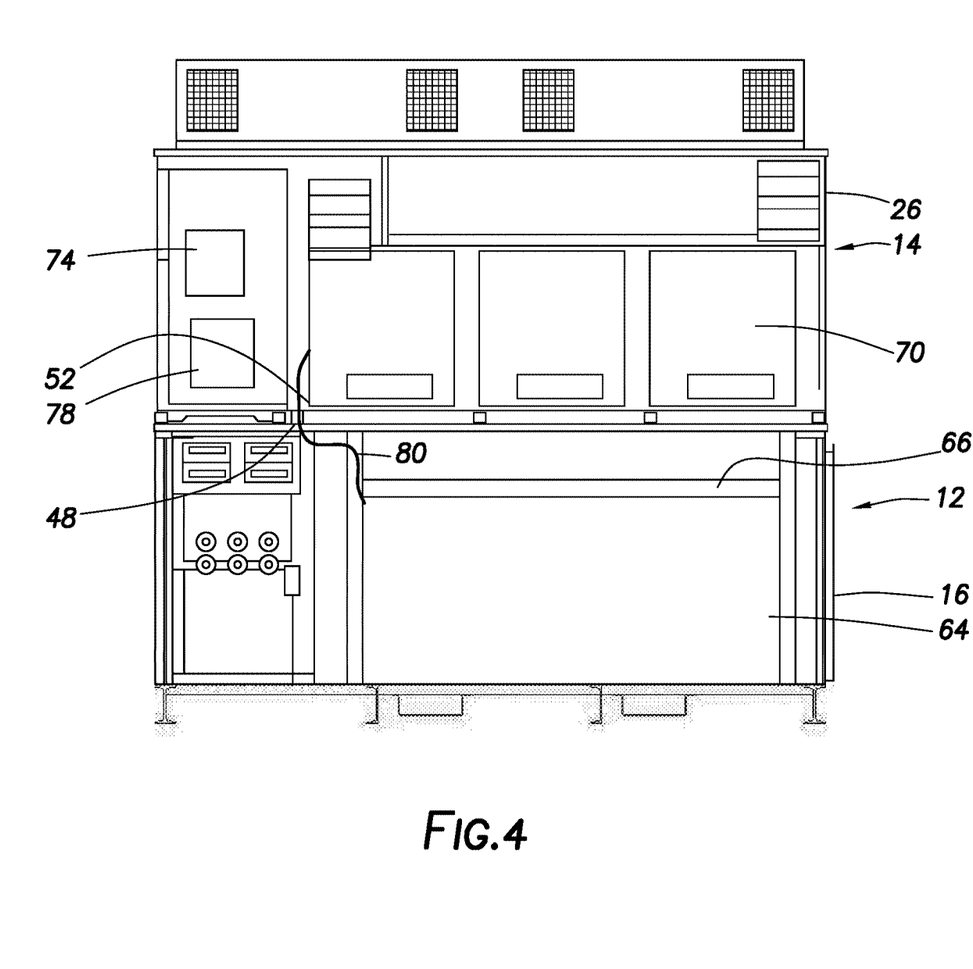
FIG. 4 is a schematic depiction of an adjustable-speed drive system installed in a stacked configuration, in accordance with an embodiment of the present disclosure.

FIG. 4 illustrates an embodiment of an adjustable-speed drive system 10d shown in the stacked configuration with transparent walls so that the internals of the system may be seen in detail. Transformer module 12 may further comprise a transformer 64 disposed within first electrical cabinet 16. A first wire tray 66 may be disposed within first electrical cabinet 16 and positioned such that wires may be run horizontally through the first electrical cabinet 16. Power inverter module 14 may further comprise a power inverter 70 disposed within second electrical cabinet 26. Power inverter module 14 may further comprise a user interface device 78 mounted along a bottom edge of the front face 74 of the second electrical cabinet 26. As would be appreciated by one of ordinary skill in the art, positioning the user interface device 78 at this location in the stacked configuration allows for ease of access.

Transformer 64 may be coupled to power inverter 70 using one or more wires 80. In the stacked configuration, the wires 80 may pass through the first electrical cabinet 16 along wire tray 66. The wires pass through the first electrical cabinet top opening 48 and the second electrical cabinet bottom opening 52

Figure 5:
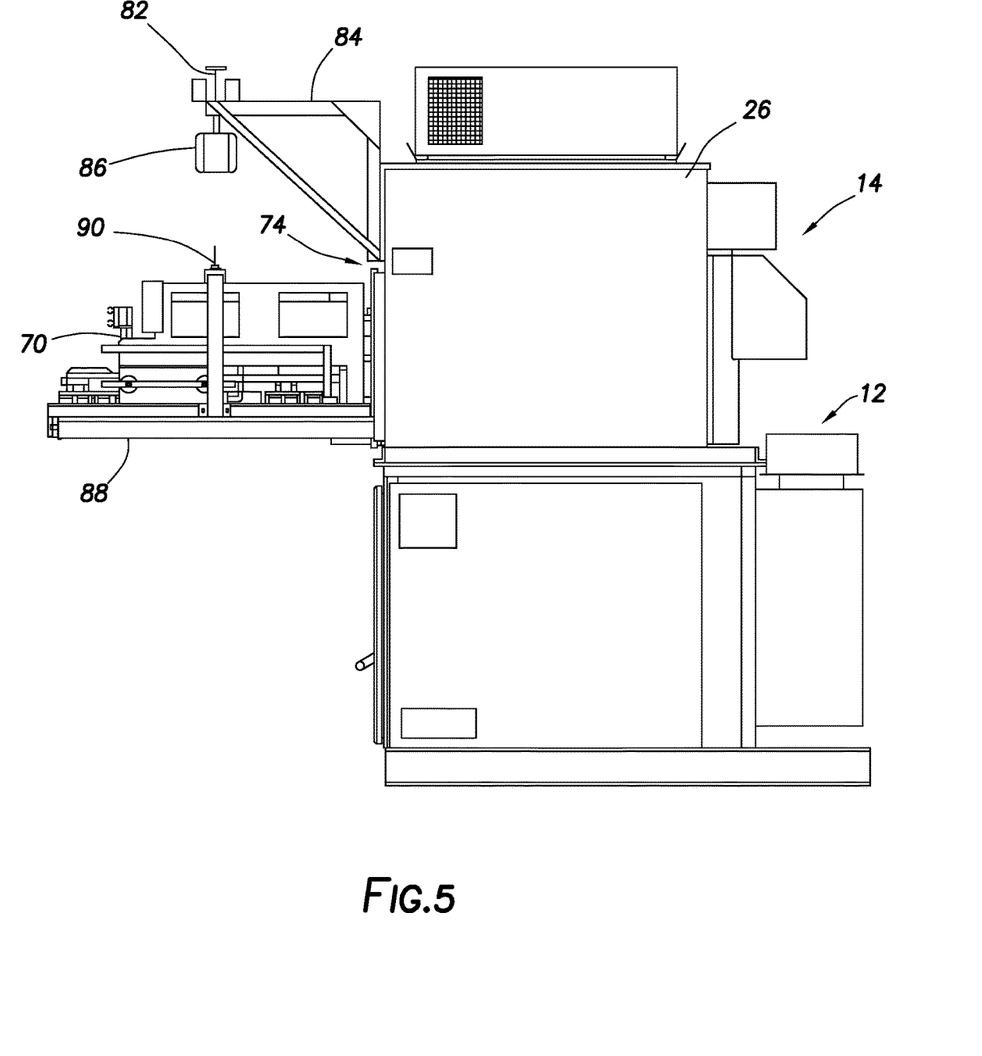
FIG. 5 is a side view of an adjustable-speed drive system installed in a stacked configuration, in accordance with an embodiment of the present disclosure.

FIG. 5 illustrates a side view of an embodiment of an adjustable-speed drive system 10 in accordance with the present disclosure. In one or more embodiments, power inverter module 14 may further comprise a power module lifting system 82. Power module lifting system 82 may be coupled to and extending from the front face 74 of second electrical cabinet 26. Power module lifting system 82 may further comprise a support bracket 84 coupled to the second electrical cabinet 26 and lifting mechanism 86. Support bracket 84 may be used to support lifting mechanism 86. Lifting mechanism 86 may be a motor, crank, or any other mechanism suitable for supporting and removing power inverter 70. Lifting mechanism 86 may also be a hoist and trolley system. Power inverter 70 may be mounted on one or more extension slides 88. Extension slides 88 may be coupled to the bottom of power inverter 70 and at least a portion of the second electrical cabinet 26. Extension slides 88 may be configured to slide in and out of second electrical cabinet 26 to allow for easy removal of power inverter 70. Power inverter 70 may further comprise a lifting mechanism 90. Lifting attachment 90 may be coupled to at least a portion of power inverter 70 and configured so that a chain (not shown) or other connector may be coupled to lifting attachment 90. The other end of chain (not shown) may be coupled to lifting mechanism 86. Lifting mechanism 86 may then raise power inverter 70 off of extension slides 88. Extension slides 88 may then be pushed back into second electrical cabinet 26 allowing lifting mechanism 86 to lower power inverter 70 to the ground or a waiting receptacle.

As would be appreciated by one or ordinary skill in the art having the benefit of the present disclosure, the features described above enable the drive systems of the present disclosure to be installed in either the side-by-side configuration or the stacked configuration.

The placement and arrangement of the low voltage control unit signal (120 volts or less) and the low voltage control unit (480 volts), allow for space to separate the low voltage signal (120 volts or less) from low voltage power (480 volts) between the modules in multiple locations. Moreover, the flexible design of the first and second electrical cabinets, allows for easy configuration for either placement.

The present disclosure also provides for methods of using said drive systems to generate an alternating current. A high voltage alternating current may be fed to the transformer module comprising a transformer disposed within a first electrical cabinet. The transformer may convert the high voltage alternating current to a lower voltage alternating current. The lower voltage alternating current may then feed to the power inverter disposed within the power inverter module. The power inverter may then convert the lower voltage alternating current to a direct current. The power inverter may then generate an alternating current stream in response to a user input. This simulated alternating current stream may then feed to a variable speed motor to control the speed of said motor.

During operation, it may be necessary to cool the two modules. The heat exchanger coupled to the first electrical cabinet may cool and circulate the internal air through the first electrical cabinet to cool the transformer. Similarly, one or more heat exchangers cool and circulate the internal air through the second electrical cabinet and one or more cooling assemblies coupled to the second electrical cabinet may move air through the one or more channels passing through the second electrical cabinet to cool the power inverter module.

Although the present disclosure and its advantages have been described in detail, it should be understood that various changes, substitutions and alterations can be made herein without departing from the spirit and scope of the disclosure as defined by the following claims.

What is claimed is:

1. An adjustable-speed drive system comprising:
    a transformer module comprising:
        a first electrical cabinet, wherein the first electrical cabinet comprises:
            a first frame comprising a plurality of metal rails;
            a plurality of first electrical cabinet covers coupled to the first frame defining a first generally rectangular box having a hollow interior;
            a first electrical cabinet side opening passing through an exterior side portion of the first electrical cabinet; and
            a first electrical cabinet top opening passing through an exterior top portion of the first electrical cabinet;
        a heat exchanger coupled to the first electrical cabinet;
        a transformer disposed within the first electrical cabinet;
        a first wire tray disposed within the first electrical cabinet and running along a horizontal path through the first electrical cabinet;
        a second wire tray disposed within the first electrical cabinet and running along a vertical path through the first electrical cabinet;
    an inverter module comprising:
        a second electrical cabinet configured for installation in either of a first position or a second position, wherein in the first position the second electrical cabinet is disposed proximate to and alongside the first electrical cabinet and in the second position the second electrical cabinet is disposed proximate to and elevated above the first electrical cabinet, wherein in the first position a top cover is coupled to and sealingly covers the first electrical cabinet top opening and a bottom cover is coupled to and sealingly covers the second electrical cabinet bottom opening; wherein in the second position a first side cover is coupled to and sealingly covers the first electrical cabinet side opening and a second side cover is coupled to and sealingly covers the second electrical cabinet side opening, wherein the first electrical cabinet and the second electrical cabinet are rated for outdoor installation;
        the second electrical cabinet comprising:
            a second electrical cabinet side opening passing through an exterior side portion of the second electrical cabinet; and
            a second electrical cabinet bottom opening passing through an exterior bottom portion of the second electrical cabinet;
        a user interface along a front face of the second electrical cabinet, wherein in the first position the user interface is mounted along a bottom edge of the second electrical cabinet and in the second position the user interface is mounted along a top edge of the second electrical cabinet;
        a power inverter disposed within the second electrical cabinet;

one or more heat exchangers coupled to the second electrical cabinet and a cooling assembly comprising:
  one or more fans mounted to the second electrical cabinet; and
  one or more air channels passing through the second electrical cabinet and coupled to the one or more fans;
a slide mechanism coupled to the bottom of the power inverter and configured to allow the power inverter to move inward and outward of the second electrical cabinet in a direction perpendicular to a front face of the second electrical cabinet; and
a lift mounted to an exterior portion of the second electrical cabinet and capable of lifting the power inverter on and off of the slide mechanism.

2. The system of claim 1 further comprising:
a plurality of wires coupled to the transformer and the power inverter, wherein:
  in the first position the plurality of wires are disposed along the first wire tray and pass through the first electrical cabinet side opening and the second electrical cabinet side opening; and
  in the second position the plurality of wires are disposed along the second wire tray and pass through the first electrical cabinet top opening and the second electrical cabinet bottom opening.

3. The system of claim 1, wherein the second electrical cabinet comprises:
a second frame comprising a plurality of metal rails; and
a plurality of second electrical cabinet covers coupled to the second frame defining a second generally rectangular box having a hollow interior.

4. The system of claim 1, wherein the second electrical cabinet further comprises:
a first low voltage control unit mounted within the second electrical cabinet along a front face of the second electrical cabinet, wherein the first low voltage control unit is configured to provide electricity at 120 volts or less; and
a second low voltage control unit mounted within the second electrical cabinet along the front face of the second electrical cabinet proximate to and alongside the low voltage control unit, wherein the second low voltage control unit is configure to provide electricity at 480 volts.

5. The system of claim 1, wherein in the second position, the transformer module further comprises a cage disposed along the outside of the first electrical cabinet.

6. The system of claim 1 further comprising a heavy duty base coupled to the bottom of the first electrical cabinet.

7. A method, comprising:
supplying a high voltage alternating current to a transformer module comprising a transformer disposed within a first electrical cabinet, wherein a heat exchanger is coupled to the first electrical cabinet, wherein the first electrical cabinet comprises:
  a first frame comprising a plurality of metal rails;
  a plurality of first electrical cabinet covers coupled to the first frame defining a first generally rectangular box having a hollow interior;
  a first electrical cabinet side opening passing through an exterior side portion of the first electrical cabinet; and
  a first electrical cabinet top opening passing through an exterior top portion of the first electrical cabinet;
converting the high voltage alternating current to a lower voltage alternating current using the transformer;
transferring the lower voltage alternating current to an inverter module comprising a power inverter disposed within a second electrical cabinet using a plurality of wires, wherein the second electrical cabinet comprises:
  a second electrical cabinet side opening passing through an exterior side portion of the second electrical cabinet; and
  a second electrical cabinet bottom opening passing through an exterior bottom portion of the second electrical cabinet;
converting the lower voltage alternating current to a direct current using the power inverter; and
generating a simulated alternating current;
wherein the transformer module and the inverter module are configured for installation in either of a first position or a second position, wherein in the first position the inverter module is disposed proximate to and alongside the transformer module and in the second position the inverter module is disposed proximate to and elevated above the transformer module, wherein in the first position a top cover is coupled to and sealingly covers the first electrical cabinet top opening and a bottom cover is coupled to and sealingly covers the second electrical cabinet bottom opening; wherein in the second position a first side cover is coupled to and sealingly covers the first electrical cabinet side opening and a second side cover is coupled to and sealingly covers the second electrical cabinet side opening, wherein the first electrical cabinet and the second electrical cabinet are rated for outdoor installation;
wherein a user interface is mounted along a front face of the second electrical cabinet, wherein in the first position the user interface is mounted along a bottom edge of the second electrical cabinet and in the second position the user interface is mounted along a top edge of the second electrical cabinet;
wherein one or more heat exchangers are coupled to the second electrical cabinet and a cooling assembly comprising:
  one or more fans mounted to the second electrical cabinet; and
  one or more air channels passing through the second electrical cabinet and coupled to the one or more fans;
wherein a slide mechanism is coupled to the bottom of the power inverter and configured to allow the power inverter to move inward and outward of the second electrical cabinet in a direction perpendicular to a front face of the second electrical cabinet; and
wherein a lift is mounted to an exterior portion of the second electrical cabinet and capable of lifting the power inverter on and off of the slide mechanism.

8. The method of claim 7, wherein in the first position, transferring the lower voltage alternating current to the inverter module comprising a power inverter disposed within a second electrical cabinet using a plurality of wires further comprises transferring the lower voltage alternating current using the plurality of wires passing through the first electrical cabinet side opening along an exterior side portion of the first electrical cabinet and the second electrical cabinet side opening along an exterior side portion of the second electrical cabinet.

9. The method of claim 7, wherein in the second position, transferring the lower voltage alternating current to the inverter module comprising a power inverter disposed within a second electrical cabinet using a plurality of wires further comprises transferring the lower voltage alternating current using the plurality of wires passing through the first electrical cabinet top opening along an exterior top portion of the first electrical cabinet and the second electrical cabinet bottom opening along an exterior bottom portion of the second electrical cabinet.

10. The method of claim 7, further comprising blowing air through the one or more channels passing through the second electrical cabinet, wherein the one or more channels do not allow outside air to contact the power inverter.

11. The method of claim 7, further comprising:
cooling the inverter module using the one or more heat exchangers coupled to the second electrical cabinet; and
cooling the transformer module using the heat exchanger coupled to the first electrical cabinet.

12. The method of claim 7, further comprising:
operating a 120V control unit to provide power to one or more circuit boards and one or more displays; and
operating a 480V control unit to provide power and control to one or more fans, one or more heat exchanges, or one or more heaters;
wherein, the low voltage control unit and the medium voltage control unit are separate.

13. The method of claim 7, further comprising feeding the simulated alternating current to a variable speed motor electrically coupled to the inverter module.

\* \* \* \* \*